United States Patent
Chao et al.

(10) Patent No.: US 8,373,250 B2
(45) Date of Patent: Feb. 12, 2013

(54) ON-CHIP INDUCTOR STRUCTURE AND METHOD FOR MANUFACTURING THE SAME

(75) Inventors: Tzu-Yuan Chao, Taoyuan County (TW); Ming-Chieh Hsu, Taipei County (TW); Yu-Ting Cheng, Hsinchu (TW); Chih Chen, Hsinchu (TW); Chien-Min Lin, Taichung County (TW)

(73) Assignee: National Chiao Tung University, Hsinchu (TW)

( * ) Notice: Subject to any disclaimer, the term of this patent is extended or adjusted under 35 U.S.C. 154(b) by 523 days.

(21) Appl. No.: 12/607,433

(22) Filed: Oct. 28, 2009

(65) Prior Publication Data
US 2011/0042782 A1   Feb. 24, 2011

(30) Foreign Application Priority Data
Aug. 21, 2009   (TW) .............................. 98128200 A

(51) Int. Cl.
*H01L 29/86* (2006.01)
(52) U.S. Cl. ................................. 257/531; 257/E29.325
(58) Field of Classification Search ................... 257/531, 257/E29.323, E21.022
See application file for complete search history.

(56) References Cited

U.S. PATENT DOCUMENTS
7,750,413 B2 * 7/2010 Hayashi et al. ............... 257/374
2009/0278240 A1 * 11/2009 Kaneko et al. ................ 257/659

OTHER PUBLICATIONS

M.C. Hsu, T.Y. Chao, Y.T. Cheng, C.M. Liu, and C. Chen, The Inductance Enhancement Study of Spiral Inductor Using Ni-AAO Nanocomposite Core, IEEE Transactions on Nanotechnology, vol. 8, No. 3, May 2009, pp. 281-285.

* cited by examiner

*Primary Examiner* — Zandra Smith
*Assistant Examiner* — Paul Patton
(74) *Attorney, Agent, or Firm* — Rosenberg, Klein & Lee

(57) ABSTRACT

The present invention relates to a an on-chip inductor structure and a method for manufacturing the same. The an on-chip inductor structure according to the present invention comprises a substrate, a porous layer, a plurality of conductors, and an inductor. The porous layer is disposed on the substrate and has a plurality of voids; each of the plurality of conductors is disposed in the plurality of voids, respectively; and the inductor is disposed on the porous layer. Because the plurality of conductors is used as the core of the inductor, the inductance is increased effectively and the area of the an on-chip inductor is reduced. Besides the manufacturing method according to the present invention is simple and compatible with the current CMOS process, the manufacturing cost can be lowered.

10 Claims, 6 Drawing Sheets

ON-CHIP INDUCTOR STRUCTURE AND METHOD FOR MANUFACTURING THE SAME

FIELD OF THE INVENTION

The present invention relates to an inductor, and particularly to an on-chip inductor structure and a method for manufacturing the same.

BACKGROUND OF THE INVENTION

With the progress of modern technologies, the coming of information era, and the prosperous development of network, various electronic products are developed for satisfying people's demand. The functions of the electronic products are becoming powerful and complete increasingly, and thus bringing convenience for people's lives. All of the current electronic products pursue miniaturization and are fastidious about lightness and thinness. Under high-density packaging, the size of the required electronic devices is becoming relatively smaller, particularly for radio-frequency integrated circuits (RFICs) applied in portable wireless communication electronic products.

Currently, for increasingly demanded RFICs, the most urgent need is not on enhancing the efficiency of active devices but on improving the characteristics of passive devices such as resistors, capacitors, and inductors. For modern semiconductor process technologies, it is not a problem to provide superior resistors and capacitors that are easy to be implemented and simulated. However, for passive inductors, the only choice is spiral inductors. The inductance of spiral inductors depends strongly on the semiconductor process adopted to fabricate them. The method for increasing the inductance of an on-chip inductor is mostly to increase the number of turns of the inductor, which will increase the occupied area, and hence is unfavorable for miniaturization of the on-chip inductor. Thereby, how to increase effectively the inductance is still a major issue for developing the on-chip inductor. In addition, the Q factor (quality factor) of the inductor will also reduce owing to substrate loss.

Accordingly, the present invention provides an on-chip inductor structure and a method for manufacturing the same for solving the problems described above. According to the present invention, the drawbacks according to the prior art as described above can be improved; the inductance can be increased; the area can be reduced; and the manufacturing cost can be lowered.

SUMMARY

An objective of the present invention is to provide an on-chip inductor structure and a method for manufacturing the same, which uses a plurality of conductors disposed in a plurality of voids in a porous layer as the core of the inductor for increasing inductance and reducing occupied area.

Another objective of the present invention is to provide an on-chip inductor structure and a method for manufacturing the same, which has a simple structure with a manufacturing method compatible with the CMOS process, and hence reducing the cost.

Still another objective of the present invention is to provide an on-chip inductor structure and a method for manufacturing the same, which has a high-intensity anisotropy magnetic field, and hence the ferromagnetic resonance (FMR) frequency is increased.

The on-chip inductor structure according to the present invention comprises a substrate, a porous layer, a plurality of conductors, and an inductor. The manufacturing method according to the present invention comprises providing the substrate, forming the porous layer with a plurality of voids on the substrate, forming the plurality of conductors in the plurality of voids, and forming the inductor on the porous layer. Because the plurality of conductors is used as the core of the inductor, the inductance of the on-chip inductor is increased effectively while the occupied area is reduced effectively. Besides, because the manufacturing method according to the present invention is compatible with the current CMOS process, the manufacturing cost can be lowered.

DETAILED DESCRIPTION

In order to make the structure and characteristics as well as the effectiveness of the present invention to be further understood and recognized, the detailed description of the present invention is provided as follows along with embodiments and accompanying figures.

Figure 1:
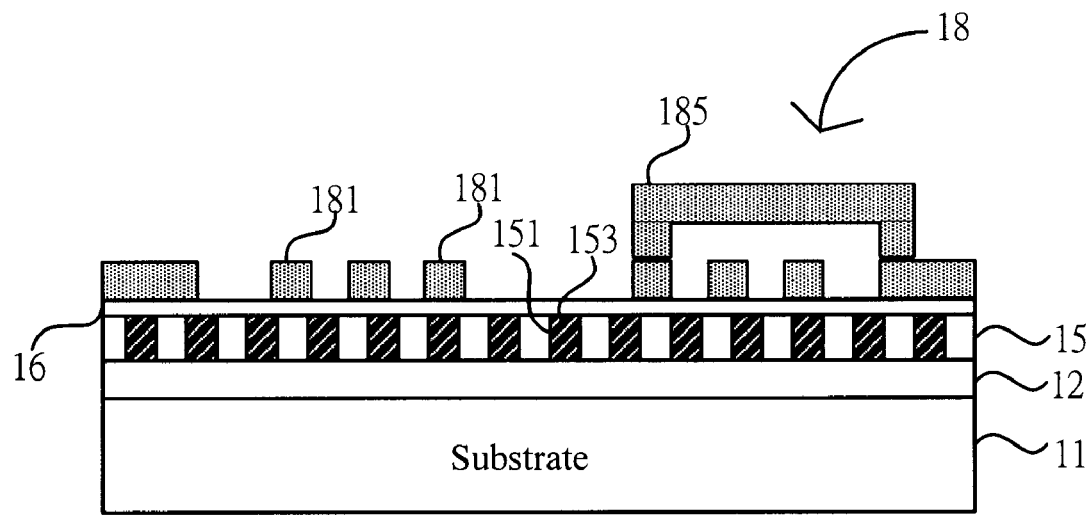
FIG. 1 shows a structure of the on-chip inductor according to a preferred embodiment of the present invention.

FIG. 1 shows a structure of the on-chip inductor according to a preferred embodiment of the present invention. As shown in the figure, the on-chip inductor according to the present invention comprises a substrate 11, a porous layer 15, a plurality of conductors 153, and an inductor 18. The porous layer 15 is disposed on the substrate 11 and has a plurality of voids 151 thereon. The plurality of conductors 153 is disposed in the plurality of voids 151. A preferred embodiment of the porous layer 15 of the on-chip inductor according to the present invention is a nanometer porous layer. The material of the conductors 153 can be any ferromagnetic material, including nickel. The porous layer 15 according to the present invention is a nonconductor. A preferred embodiment of the porous layer 15 is, but not limited to, an aluminum oxide layer.

Figure 2:
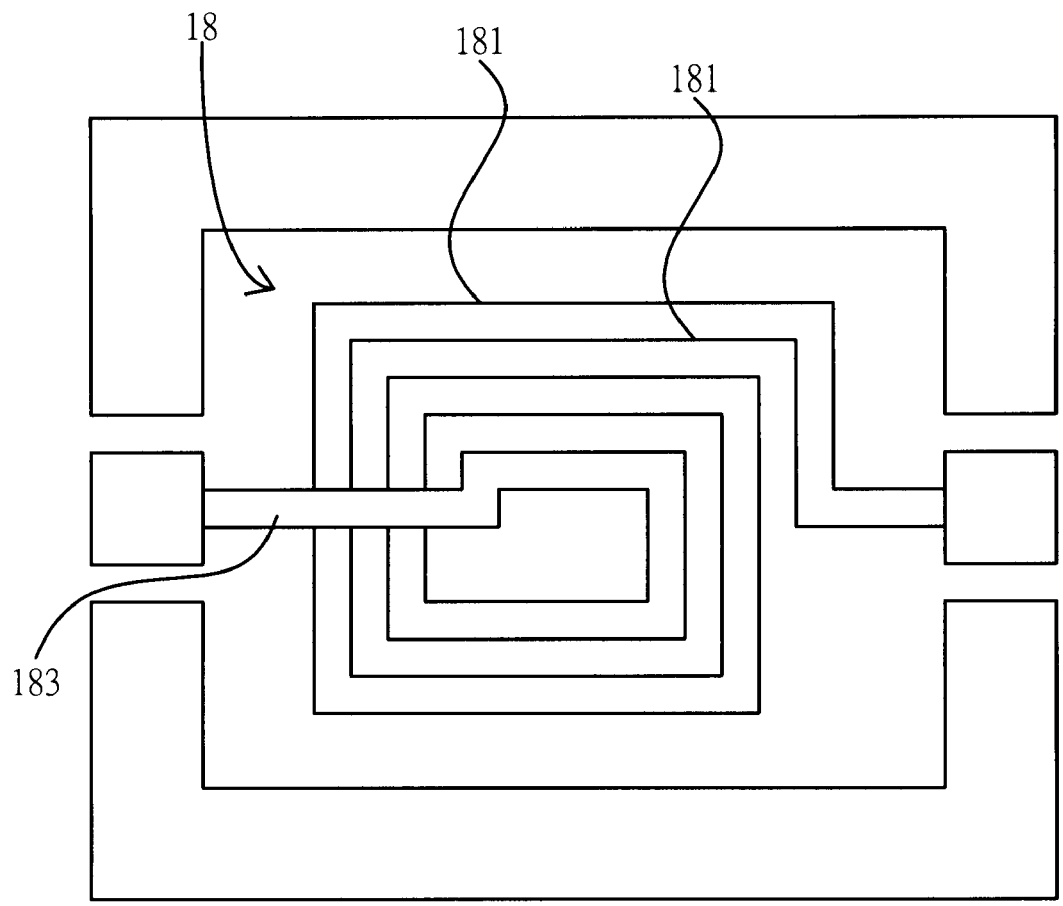
FIG. 2 shows a top view of the on-chip inductor according to a preferred embodiment of the present invention.

Because the porous layer 15 according to the present invention is nonconductive and voids 151 do not communicate with each other, the conductors 153 are isolated electrically from each other. A preferred embodiment of the conductor 153 according to the present invention is pillar shaped. The depth-to-width ratio according to an embodiment of the conductor 153 is greater than 3:1. The geometry of the conductor 153 can be determined according to the thickness of the porous layer 15 and the diameter of the voids 151. The inductor 18 is disposed on the porous layer 15. An embodiment of the inductor according to the present invention is a spiral inductor, which comprises a plurality of coils 181 and an interconnection wire 185. As shown in FIG. 2, the interconnection wire 185 is a crossover wire used for connecting to the innermost coil 181 of the inductor 18 and crossing over other coils 181. According to an embodiment of the present invention, the shape of the inductor 18 can be any geometrical shape, for example, a rectangle, an octagon, or a circle. The on-chip inductor structure according to the present invention further comprises an insulation layer 12 disposed on the substrate 11 and between the substrate 11 and the porous layer 15 for isolating electrically the substrate 11 and the porous layer 15.

According to the present invention, the porous layer 15 is disposed, and the plurality of conductors 153 is disposed in the plurality of voids 151 of the porous layer 15 to form a composite material as the core. Thereby, the inductance of the inductor 18 is increased effectively. In comparison with the on-chip inductor according to the prior art, the on-chip inductor according to the present invention can reduced effectively the occupied chip area by the inductor, and this achieving the objective of miniaturization. Additionally, the on-chip inductor according to the present invention has a simple structure, and hence lowering the production cost.

Figure 3A:
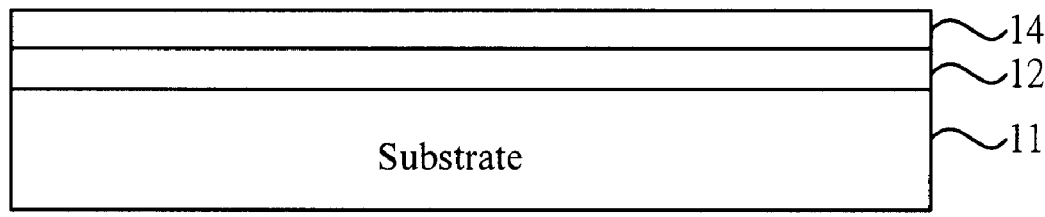
FIG. 3A to FIG. 3H show structural schematic diagrams of the manufacturing process for the on-chip inductor according to a preferred embodiment of the present invention.
Figure 3B:
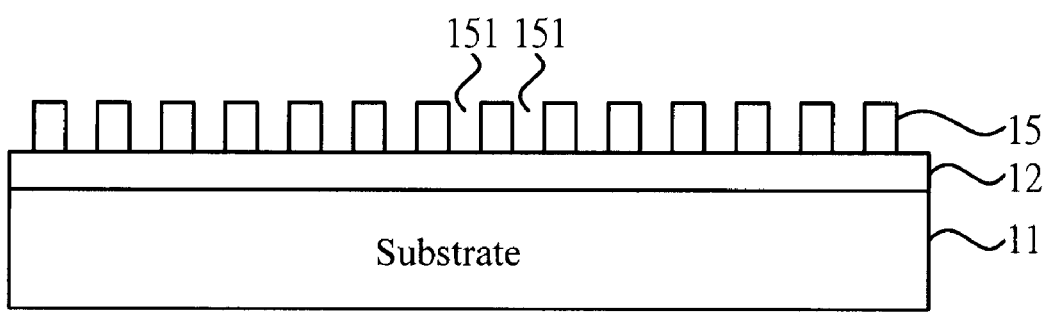
Figure 3C:
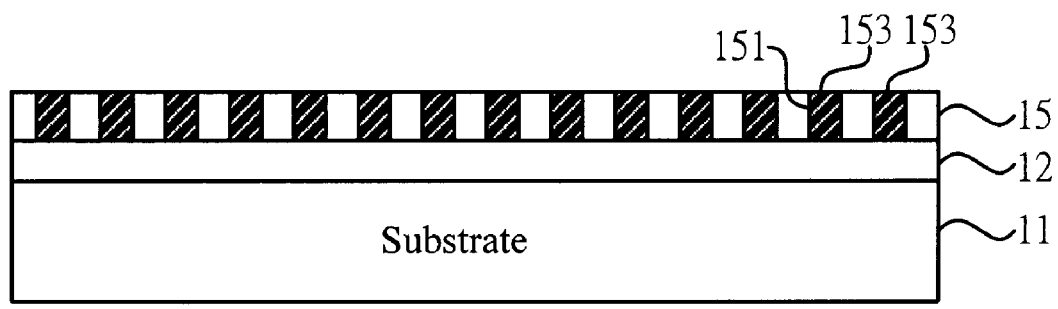

FIG. 3A to FIG. 3H show structural schematic diagrams of the manufacturing process for the on-chip inductor according to a preferred embodiment of the present invention. First, as shown in FIG. 3A, the substrate 11 is provided and the nonconductive layer 14 is formed on the substrate 11 for forming voids 151 in the nonconductive layer 14 and thus forming the porous layer 15 as shown in FIG. 3B. In addition, before the step of forming the porous layer 15, the insulation layer 12 is firstly formed on the substrate 11 for isolating electrically the substrate 11 from the porous layer 15. Next, as shown in FIG. 3B, the voids 151 are formed in the nonconductive layer 14 for forming the porous layer 15. A preferred embodiment of the nonconductive layer 14 as described above is an aluminum oxide layer. Then, as shown in FIG. 3C, the conductors 153 are formed in the voids 151 for forming a composite material as the core. Afterwards, the subsequent step of forming the inductor 18 on the porous layer 15 can be performed.

In the step of forming the nonconductive layer 14 described above, an aluminum layer is formed first. Then, oxidizing the aluminum layer forms the aluminum oxide layer, namely, the nonconductive layer 14. The above-mentioned method of forming the aluminum oxide layer as the nonconductive layer 14 is only an embodiment of the present invention. According to the present invention, evaporation deposition can be used for forming an aluminum layer on the substrate 11. Then the anodizing process can be used to oxide the aluminum layer for forming the nonconductive layer 14. A method for fabricating the porous layer 15 according to the present invention is performing the anodizing process in various acid solutions on the aluminum layer. In the process, different specific parameters, such as applied voltage, current, temperature, and time, are controlled. These parameters have great correlation on the diameters and length of the plurality of voids 151. An embodiment of the present invention is to put the aluminum layer in a 0.3M oxalic acid ($H_2C_2O_4$) solution and apply 40 volts to the aluminum layer at room temperature until the aluminum layer is oxidized completely. Then the aluminum oxide layer is formed as the nonconductive layer 14.

After the aluminum layer is oxidized completely, the aluminum oxide layer is annealed at 400° C. for two hours for reinforcing its structure. Then, dispose the annealed nonconductive layer 14 in a 5% phosphoric acid ($H_3PO_4$) solution at 30° C. for 50 minutes for forming uniformly distributed nanometer voids 151. The diameter of the plurality of voids 151 is 70 nm. Thereby, the porous layer 15 is formed. Next, form the conductors 153 in the plurality of voids 151. According to an embodiment of the present invention, immerse the porous layer 15 in tin chloride ($SnCl_2$) solution for two minutes and palladium chloride ($PdCl_2$) solution for 30 seconds, respectively, for activating the surface of the porous layer 15. Subsequently, electroplate nickel to the porous layer 15 at 60° C. for one minute for forming the conductors 153 in the porous layer 15. The electroplating described above can be electroless plating. Afterwards, polish the surface of the porous layer 15 for removing nickel thereon for isolating electrically the conductors 153 (nickel) in the plurality of voids 151 of the porous layer 15, and thus reducing eddy current loss. Moreover, rapid thermal annealing can be further performed at 400° C. for two minutes for improving magnetic characteristics of the conductors 153.

The method described above is only an embodiment of the present invention, not used for limiting the method for forming the porous layer 15. Beside, the material of the conductors 153 is not limited to nickel. Any other ferromagnetic material can be used as well. By using the porous layer 15 and the conductors 153 as the core, the strength of anisotropy magnetic field is high, thus increasing the ferromagnetic resonance (FMR) frequency.

Figure 3D:
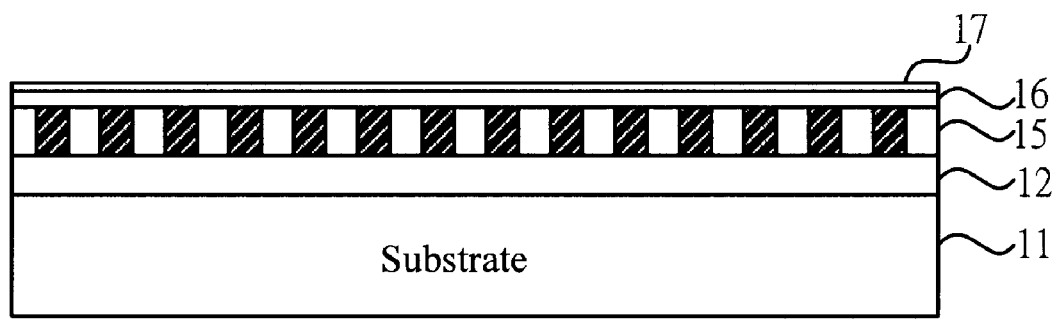
Figure 3E:
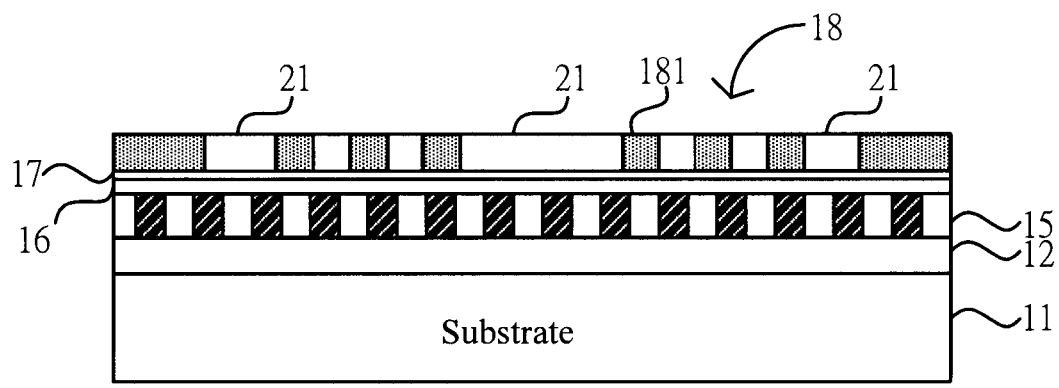

After the porous layer 15 is completed, the process of forming the inductor 18 can be performed subsequently. As shown in FIG. 3D, before forming the inductor 18, the insulation layer 16 is firstly formed on the porous layer 15 and between the porous layer 15 and the inductor 18 for isolating electrically the porous layer 15 from the inductor 18. According to the present invention, a method for forming the inductor 18 is electroplating as described in detail as follows. Referring to FIG. 3D, a first seed layer 17 is formed first on the insulation layer 16. Next, as shown in FIG. 3E, form a first photoresist layer 21 on the first seed layer 17 according to the desired pattern of the coils 181 of the inductor 18 for masking part of the first send layer 17. Then, a first metal layer is formed on the part of the first seed layers 17 not masked by the first photoresist layer 21. That is to say, the plurality of coils 181 of the inductor 18 is formed on the first seed layer 17.

Figure 3F:
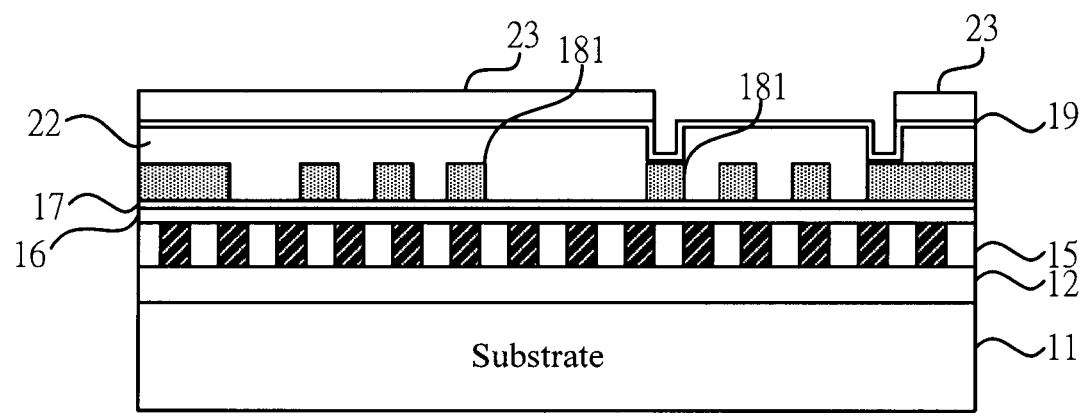
Figure 3G:
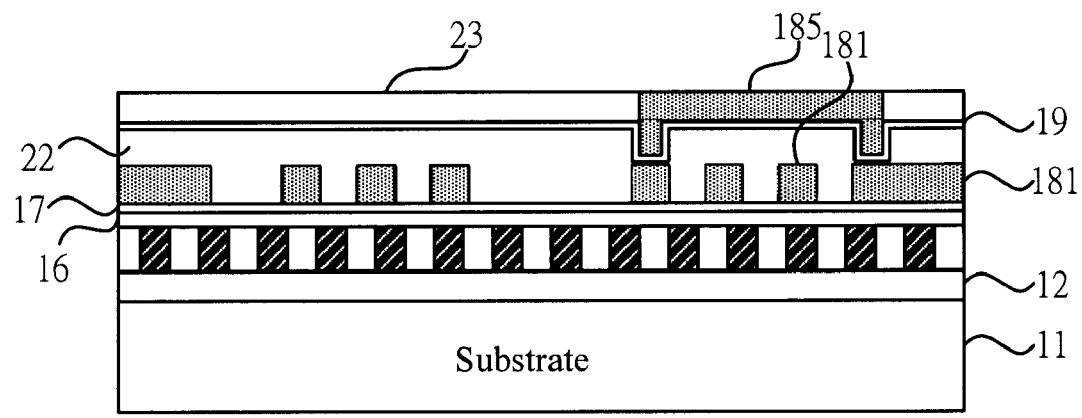
Figure 3H:
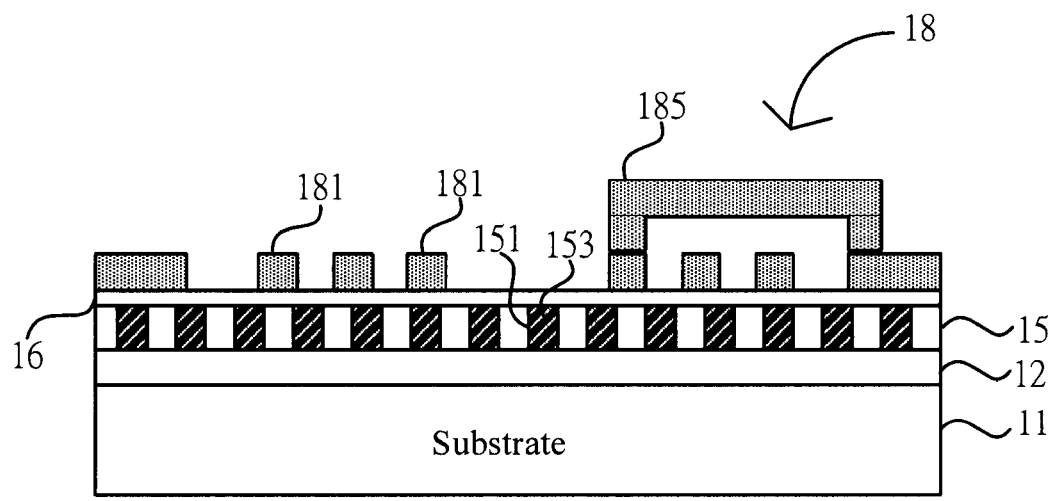

Next, as shown in FIG. 3F, remove the first photoresist layer 21 and form a second photoresist layer 22 on the first metal layer for masking the first metal layer, namely, the masking the coils 181. The pattern of the second photoresist layer 22 is bridge shaped for subsequently forming the interconnection wire 185, namely, forming the crossover of the inductor 18 used for connecting to the innermost coil 181 of the inductor 18 and crossing over the rest of the coils 181. Then, form a second seed layer 19 on the second photoresist layer 22 and form a third photoresist layer 23 on the second seed layer 19. However, the third photoresist 23 does not mask completely the second seed layer 19. Afterwards, referring to FIG. 3G, form a second metal layer on the second seed layer 19 not masked by the third photoresist layer 23 for forming the interconnection wire 185. Finally, referring to FIG. 3H, remove the second and third photoresist layers 22, 23, and the on-chip inductor shown in FIG. 1 is thereby completed. The materials of the first and second metal layers described above include copper. In other words, the materials of the coils of the inductor 18 and of the interconnection wire 185 can be, but not limited to, copper. Additionally, the materials of the first and second seed layers 17, 19 include copper as well. Moreover, the material of the first seed layer 17 further includes titanium.

Because the porous layer 15 is disposed on the substrate 11 and the conductors 153 are disposed in the voids 151 of the porous layer 15 for forming a composite material as the core, the inductance can be increased effectively while reducing the area occupied by the inductor 18 effectively for achieving the required inductance. In addition, because the process according to the present invention is simple and compatible with the current CMOS process, while performing the CMOS process according to the prior art, the on-chip inductor according to the present invention can be manufactured simultaneously. Thereby, no special equipment is needed and hence the cost can be lowered. Besides, the present invention is suitable for inductors of any geometrical shapes without limitations. According to the present invention, by increasing the distribution density of the voids 151 of the porous layer 15, the inductance of the inductor 18 can be increased. Furthermore, according to the present invention, because the conductors 153 are used as the core of the inductor 18, the FMR frequency can be increased and hence the influence of ferromagnetic resonance can be eliminated. Consequently, the Q performance of the inductor 18 is maintained.

To sum up, the on-chip inductor structure according to the present invention comprises a substrate, a porous layer, a plurality of conductors, and an inductor. The manufacturing method according to the present invention comprises providing a substrate, forming a porous layer with a plurality of voids on the substrate, forming a plurality of conductors isolated from each other in the plurality of voids, and forming an inductor on the porous layer. Because the plurality of conductors is used as the core of the inductor, the inductance of the on-chip inductor is increased effectively and still increases at high frequencies. Thereby, the area occupied by the inductor is reduced effectively, which is beneficial for miniaturization. Besides, because the manufacturing method according to the present invention is compatible with the current CMOS process, the manufacturing cost can be lowered.

Accordingly, the present invention conforms to the legal requirements owing to its novelty, nonobviousness, and utility. However, the foregoing description is only embodiments of the present invention, not used to limit the scope and range of the present invention. Those equivalent changes or modifications made according to the shape, structure, feature, or spirit described in the claims of the present invention are included in the appended claims of the present invention.

The invention claimed is:

1. An on-chip inductor structure, comprising:
   a substrate;
   a porous layer, disposed on said substrate, and having a plurality of voids;
   a plurality of conductors, disposed in said plurality of voids, said conductors are pillar shaped, the depth-to-width ratio of said conductors is greater than 3:1; and
   an inductor, disposed on said porous layer.

2. The on-chip inductor structure of claim 1, and further comprising an insulation layer, disposed on said substrate, and between said substrate and said porous layer.

3. The on-chip inductor structure of claim 1, and further comprising an insulation layer, disposed on said porous layer, and between said porous layer and said inductor.

4. The on-chip inductor structure of claim 1, wherein said inductor includes a plurality of coils.

5. The on-chip inductor structure of claim 1, wherein said porous layer is a nanometer porous layer.

6. The on-chip inductor structure of claim 1, wherein the material of said plurality of conductors is a ferromagnetic material.

7. The on-chip inductor structure of claim 6, wherein the material of the ferromagnetic material includes nickel.

8. The on- chip inductor structure of claim 1, wherein said conductors are pillar shaped.

9. The on-chip inductor structure of claim 1, wherein said porous layer is a nonconductor.

10. The on-chip inductor structure of claim 1, wherein said porous layer is an aluminum oxide layer.

* * * * *